United States Patent
Manpuku et al.

(10) Patent No.: US 6,189,943 B1
(45) Date of Patent: Feb. 20, 2001

(54) ROBOT HAND

(75) Inventors: Yasuhiro Manpuku, Oume; Kazunori Hiranuma; Mamoru Takashina, both of Hachioji, all of (JP)

(73) Assignee: Tokyo Seimitsu Co., Ltd., Tokyo (JP)

( * ) Notice: Under 35 U.S.C. 154(b), the term of this patent shall be extended for 0 days.

(21) Appl. No.: 09/356,011

(22) Filed: Jul. 16, 1999

(30) Foreign Application Priority Data

Dec. 15, 1998 (JP) .................................................. 10-356300

(51) Int. Cl.⁷ .......................................................... B25J 15/06
(52) U.S. Cl. .............................. 294/64.1; 294/902; 901/40
(58) Field of Search .................................. 294/1.1, 64.1, 294/65, 902; 29/743; 269/21; 279/3; 414/627, 737, 752, 935, 941; 901/40

(56) References Cited

U.S. PATENT DOCUMENTS

| | | | |
|---|---|---|---|
| 2,956,769 | * | 10/1960 | Sigler et al. ..................... 294/64.1 X |
| 3,377,096 | * | 4/1968 | Wood .................................. 294/64.1 |
| 4,049,484 | * | 9/1977 | Priest et al. ..................... 294/64.1 X |
| 4,881,770 | * | 11/1989 | Marzinotto et al. ................ 294/64.1 |

FOREIGN PATENT DOCUMENTS

| | | | |
|---|---|---|---|
| 4040570 | * | 7/1991 | (DE) .................................. 294/64.1 |
| 360984 | * | 3/1991 | (JP) .................................. 294/64.1 |
| 3264287 | * | 11/1991 | (JP) .................................. 294/64.1 |
| 6-71689 | | 9/1994 | (JP) . |

* cited by examiner

*Primary Examiner*—Johnny D. Cherry
(74) *Attorney, Agent, or Firm*—Christie, Parker & Hale, LLP

(57) ABSTRACT

In a robot hand of an automatic handling robot for holding and carrying a semiconductor wafer or the like, the robot hand 10 itself is made of a porous material, for example, porous ceramic, and the surface portion thereof other than portions corresponding to a wafer suction portion 13 and a suction air intake 14 is coated with a film which does not permit the passage of air, for example, fluorocarbon resin or the like. Air can pass through the porous portion.

17 Claims, 2 Drawing Sheets

ROBOT HAND

BACKGROUND OF THE INVENTION

1. Field of the Invention

The present invention relates to a robot hand of an automatic handling robot in a semiconductor manufacturing device or an inspection device to inspect semiconductor wafers in the manufacturing process thereof, etc., which is used for carrying semiconductor wafers from a wafer cassette to the devices.

2. Description of the Related Art

In a known robot hand of an automatic handling robot for carrying a wafer from a wafer cassette to an inspection device or the like, a mechanism in which a wafer is held by vacuum suction is adopted. The known holding mechanism is shown in FIGS. 3 and 4. Namely, a robot hand 1 is provided on its one end with a suction air intake 2, and on the other end thereof with a plurality of suction portions 3. A groove 4 for an air passage is provided to connect the suction air intake 2 with the suction portions 3 and to interconnect the suction portions 3. The groove 4 is covered by a cover 5 adhered thereto.

In use, the robot hand 1 is inserted in a gap of a predetermined pitch between adjacent wafers in the cassette to hold a wafer through the suction portion 3 due to vacuum suction and remove the wafer from the cassette. Thereafter, the robot hand 1 transfers the wafer to a wafer chuck portion of the inspection device or the like. The robot hand is inserted in a robot hand transferring/receiving recess formed on the wafer chuck portion to hold the wafer by the chuck portion due to vacuum suction. Consequently, the wafer is delivered from the robot hand. The robot hand is removed from the recess. Thus, the robot hand delivers the wafers from the cassette to the wafer chuck portion.

As described above, since it is necessary to insert the robot hand into the gap between the wafers in the cassette and into the robot hand transferring/receiving recess of the wafer chuck portion, the robot hand must be very thin, i.e., about 3 mm in thickness, and furthermore, a groove for air passage of not more than about 1 mm in depth must be provided. Consequently, the strength is reduced, so that the robot hand can be easily broken.

In recent years, the holding method of a wafer has been changed from a support at points to a support by a surface, in accordance with an increase in the diameter and the precision of a wafer. To prevent a wafer from being deformed, it is desirable to hold the wafer by as large a surface as possible. Consequently, it is difficult to form a wafer transferring/receiving recess whose width is large enough to transfer or receive the wafer in the wafer chuck portion, and hence the width of the robot hand must be made small. This also makes it difficult to obtain a rigid and sufficiently strong robot hand.

SUMMARY OF THE INVENTION

In view of above-mentioned problems that the thickness and the width of the robot hand must be decreased, in spite of an increase in the weight of a wafer due to an increase in the diameter, the object of the present invention is to provide a rigid robot hand having sufficient strength, which can be made thin and small in width, and in which no groove is necessary.

In an embodiment of the present invention, the robot hand is made of a porous material, and the robot hand is coated with a film, which does not permit air to pass therethrough, at a surface portion thereof other than suction air intake and suction portion for holding the wafer. Accordingly, the robot hand can be made thin and narrow and with sufficient strength. In addition, it is not necessary to provide the groove used in a known robot hand.

Furthermore, in an embodiment of the present invention, the porous material is porous ceramic, and the film to prevent the passage of air is made of a fluorocarbon resin coat.

The present invention may be more fully understood from the description of preferred embodiments of the invention set forth below, together with the accompanying drawings.

DESCRIPTION OF THE PREFERRED EMBODIMENT

Figure 1:
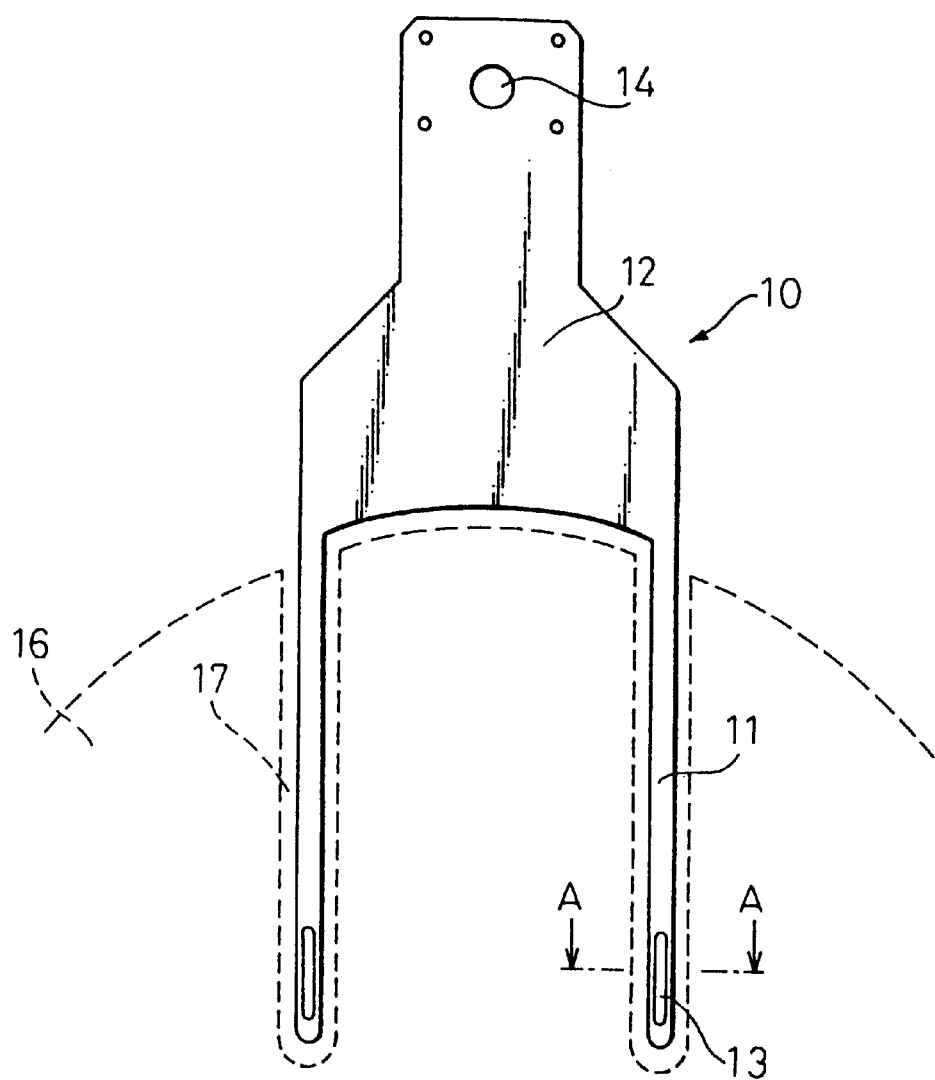
FIG. 1 is a plan view of an embodiment of a robot hand according to the present invention.
Figure 2:
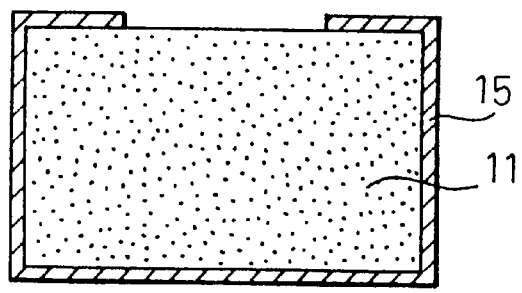
FIG. 2 is a sectional view of a robot hand of the present invention taken along the line A—A in FIG. 1.
Figure 3:
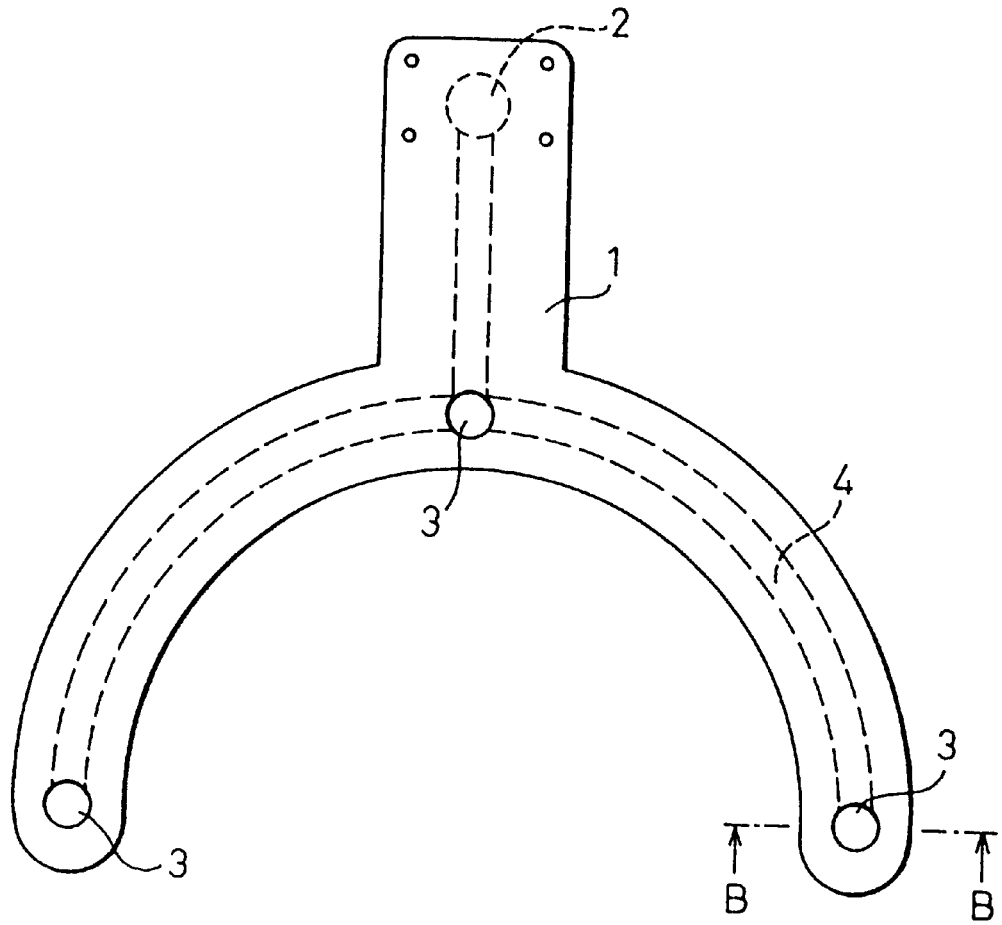
FIG. 3 is a plan view of a known robot hand.
Figure 4:
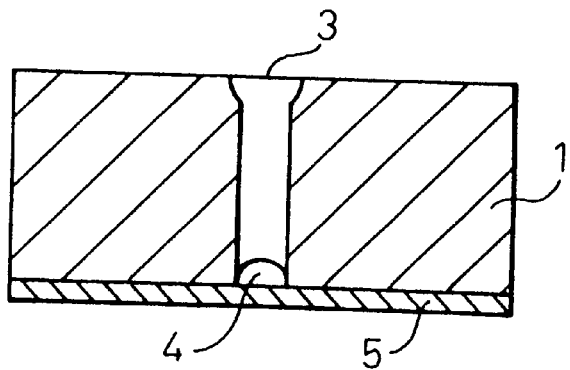
FIG. 4 is a sectional view of a known robot hand, taken along the line B—B in FIG. 3.

An embodiment of a robot hand according to the present invention will be described below. FIG. 1 is a plan view of an embodiment of the robot hand according to the present invention, and FIG. 2 is a sectional view taken along the line A—A in FIG. 1. The robot hand 10 has a hand body portion 12 having bifurcated finger portions 11 formed integrally therewith. The finger portions 11 are provided, on one of the surfaces at the front ends thereof, with suction portions 13 to hold a wafer due to vacuum suction. The hand body portion 12 is provided on its end with a suction air intake 14 which opens into the surface on which the suction portion 13 is formed or into the other surface opposite thereto.

The entirety of the robot hand 10 is made of a porous material, for example, porous ceramic, porous metal, porous graphite or the like. The robot hand 10 is coated with a film 15, which does not permit air to pass therethrough, at the surface portion thereof other than the suction portions 13 and the suction air intake 14. The coating is formed by, for example, painting the surface portion with fluorocarbon resin or the like, while masking the portions corresponding to the suction portions 13 and the suction air intake 14. After coating, the mask is removed to form the suction portions 13 and the suction air intake 14. Four threaded holes for connection with an automatic handling robot (not shown) are provided at the end of the hand body portion 12 of the robot hand 10. In FIG. 1, a wafer chuck portion 16 and wafer transferring/receiving recesses 17 formed in the chuck portion are indicated by a phantom line. FIG. 1 shows the robot hand inserted in the wafer transferring/receiving recesses.

In the illustrated embodiment of the present invention, the robot hand can have sufficient strength if the width of the finger portion 11 is about 5 mm and the thickness thereof is about 3 mm. Therefore, the wafer transferring/receiving recesses 17 of the wafer chuck portion 16 can be made narrow so that the wafer can be vacuum-held by a wide surface of the wafer chuck portion.

With the robot hand of an embodiment of the present invention as described above, when the suction air intake 14 is connected to a suction device (not shown), air is introduced into the suction portions 13, flows in small holes of the porous material of which the robot hand is made, and is sucked through the suction air intake 14 into the suction device, so that the wafer can be vacuum-held.

Although the robot hand of an embodiment described above has bifurcated finger portions, the robot hand is not limited to the specific shape but can be in the form of a rod or may be provided with more fingers. The robot hand can be of any shape so long as it is suitable for vacuum-holding wafers, depending on the shape of the wafer transferring/receiving recesses of the wafer chuck portion.

Furthermore, although the coating of an embodiment described above is formed by painting the surface portion with fluorocarbon resin or the like, plating, adhering with an adhesive tape, impregnating with a soft elastic material and the like may also be applied to the surface portion of the robot hand other than the suction portion and the suction air intake.

As described above, with the robot hand of the present invention, since the robot hand itself is made of a porous material, it is not necessary to form a groove for air passage, and thus a thin, narrow finger portion of sufficient strength to hold a wafer due to vacuum suction can be obtained. Therefore, it can satisfactorily respond to the requirement of an increase in the wafer diameter. In addition, no breakage of the robot hand during the formation of the groove occurs.

While the invention has been described by reference to specific embodiments chosen for purposes of illustration, it should be apparent that numerous modifications could be made thereto by those skilled in the art without departing from the basic concept and scope of the invention.

What is claimed is:

1. A robot hand of an automatic handling robot for holding and carrying a semiconductor wafer or the like, wherein said robot hand is made of a rigid porous material, and said robot hand is coated with a film, which does not permit air to pass therethrough, at a surface portion thereof other than at a suction air intake and at a suction portion for holding the wafer.

2. A robot hand according to claim 1, wherein said porous material is porous ceramic.

3. A robot hand according to claim 1, wherein said film to prevent the passage of air is made of fluorocarbon resin coat.

4. A robot hand according to claim 1, wherein said porous material is porous ceramic, and said film to prevent the passage of air is made of a fluorocarbon resin coat.

5. A robot hand of an automatic handling robot for holding and carrying a semiconductor wafer or the like, wherein said robot hand is made of a rigid porous material, coated with and engaged by, a film which does not permit air to pass therethrough, at all surface portions thereof, other than at a suction air intake and at a suction portion for holding the wafer.

6. The robot hand of claim 5, wherein the coating for preventing the passage of air therethrough is applied by painting.

7. The robot hand of claim 5, wherein the coating for preventing the passage of air therethrough is applied by plating.

8. The robot hand of claim 5, wherein the coating for preventing the passage of air therethrough is applied by impregnating the robot hand with the material.

9. The robot hand of claim 5, wherein the coating for preventing the passage of air therethrough is applied by adhering the coating to the robot hand.

10. A robot hand of an automatic handling robot for holding and carrying a semiconductor wafer or the like, the hand having a body portion and at least two finger portions extending forwardly thereof, each finger portion having a suction portion disposed proximate its forward extent, wherein said robot hand is made of a rigid porous material, coated with and engaged by, a film which does not permit air to pass therethrough, at all surface portions thereof, other than at a suction air intake and at the suction portion for holding the wafer.

11. The robot hand of claim 10, wherein the rigid porous material has sufficient strength to support a wafer due to vacuum suction.

12. The robot hand of claim 10, wherein the fingers are of about 5 mm in width and are of about 3 mm in thickness.

13. The robot hand of claim 10, wherein the fingers are without a groove formed therein for the passage of air.

14. The robot hand of claim 10, wherein the coating for preventing the passage of air therethrough is applied by painting.

15. The robot hand of claim 10, wherein the coating for preventing the passage of air therethrough is applied by plating.

16. The robot hand of claim 10, wherein the coating for preventing the passage of air therethrough is applied by impregnating the robot hand with the material.

17. The robot hand of claim 10, wherein the coating for preventing the passage of air therethrough is applied by adhering the coating to the robot hand.

* * * * *